United States Patent
Ramadoss et al.

(10) Patent No.: US 7,629,910 B2
(45) Date of Patent: Dec. 8, 2009

(54) METHODS AND APPARATUS TO CONTROL CURRENT STEERING DIGITAL TO ANALOG CONVERTERS

(75) Inventors: Sriram Ramadoss, Bangalore (IN); Sumeet Mathur, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 11 days.

(21) Appl. No.: 11/864,979

(22) Filed: Sep. 29, 2007

(65) Prior Publication Data

US 2008/0272949 A1    Nov. 6, 2008

Related U.S. Application Data

(63) Continuation-in-part of application No. 11/848,181, filed on Aug. 30, 2007, now abandoned.

(60) Provisional application No. 60/823,977, filed on Aug. 30, 2006.

(51) Int. Cl.
  *H03M 1/00* (2006.01)
(52) U.S. Cl. ...................... 341/136; 341/144
(58) Field of Classification Search ............ 341/136, 341/144; 327/65
  See application file for complete search history.

(56) References Cited

U.S. PATENT DOCUMENTS

| | | | | |
|---|---|---|---|---|
| 6,930,533 | B2 * | 8/2005 | Budak et al. | 327/379 |
| 7,304,595 | B2 * | 12/2007 | Yamaoka | 341/144 |
| 2004/0140830 | A1 * | 7/2004 | Mulder et al. | 327/65 |
| 2005/0225465 | A1 * | 10/2005 | Zhang et al. | 341/144 |
| 2008/0036536 | A1 * | 2/2008 | Khorramabadi | 330/252 |

* cited by examiner

*Primary Examiner*—Rexford N Barnie
*Assistant Examiner*—Joseph Lauture
(74) *Attorney, Agent, or Firm*—John J. Patti; Wade J. Brady, III; Frederick J. Telecky, Jr.

(57) ABSTRACT

Methods and apparatus to control current steering digital to analog converters are described herein. In one example, a digital to analog converter includes a first unit cell including a positive output and a negative output, wherein the positive output of the first unit cell and the negative output of the first unit cell comprise substantially equal magnitudes and wherein the positive and negative outputs of the first unit cell are substantially one hundred eighty degrees out of phase; and a second unit cell including a positive output and a negative output, wherein the positive output of the second unit cell is substantially zero when the negative output of the second unit cell is non-zero.

4 Claims, 6 Drawing Sheets

US 7,629,910 B2

METHODS AND APPARATUS TO CONTROL CURRENT STEERING DIGITAL TO ANALOG CONVERTERS

CROSS-REFERENCE TO RELATED APPLICATIONS

This application is a continuation-in-part of U.S. Ser. No. 11/848,181, filed on Aug. 30, 2007, which claims the benefit of U.S. Provisional Application No. 60/823,977, filed Aug. 30, 2006. The contents of U.S. Ser. Nos. 11/848,181 and 60/823,977 are hereby incorporated by reference in their entirety.

TECHNICAL FIELD

The present disclosure is generally directed to digital to analog converters (DACs) and, more specifically, to methods and apparatus to control current steering digital to analog converters.

BACKGROUND

Current steering DACs receive digital input signals and produce positive and negative analog output currents based thereon. The positive and negative output currents are supplied from connections that are typically referred to as IOUT+ and IOUT−, and a differential voltage corresponding to the digital input signal is produced therebetween.

To facilitate current generation and steering functionality, current steering DACs include several parallel-connected unit cells, each of which includes a current source (typically including a transistor), cascode transistors, an amplifier, and switches. Each unit cell is controlled by a decoder that receives digital input signals that are to be converted to analog signals and produces drive signals that control the switches to produce the proper analog output current from the unit cell based on the digital input signals. The sum of the currents produced by the unit cells is the resulting overall analog current corresponding to the digital input signal.

An example, bias circuit 102 and unit cell 104 are shown in FIG. 1. A bias voltage, VBIAS, is provided to a buffer 106 that is coupled to the base of a transistor 108, which acts as a current source for the unit cell 104. The transistor 108 is coupled between a ground node 110 and a node 112 to which switches 114 and 116 are coupled. Cascode transistors 118, 120 are respectively coupled to the switches 114, 116. Currents are provided from the unit cell 104 by the cascode transistors 118, 120 at nodes IOUT+ and IOUT−. As shown in FIG. 1, various parasitic capacitances result between the inputs to the switches 114, 116 and the node 112. As a result, digital signals provided to the switch inputs are coupled to the node 112 via the parasitic capacitances. As such, when one or both of the inputs to the switches 114, 116 transitions from a logical one to a logical zero, this transient is conveyed to the node 112, which discharges the node 112 to a zero voltage and couples glitches to the gate of the transistor 108.

The unit cells in a DAC either all operate in a class A mode or all operate in a class B mode, based on the drive signals that control the switches in the unit cells. In the class A mode of operation, the drive signals controlling the switches are always complementary to each other, so that the current from the current source always goes to either IOUT+ or IOUT−. Thus, in the class A mode of operation, a constant current is drawn from the power supply, regardless of whether the output differential voltage is at zero or at its peak. For example, as shown in FIG. 2, digital signals provided to the DAC indicate that the DAC is to output a sinusoidal differential current signal 200, which can easily be converted to a differential voltage using a resistor. To that end, the decoder produces drive signals that are fed to switches in the unit cells. These switches controlled by the drive signals result in the output of complementary sinusoidal current signals on IOUT+ 202 and IOUT− 204 that range in amplitude between 0 amperes (A) and, for example, 0.04 A and that intersect at one-half amplitude (i.e., in FIG. 2 the signals 202 and 204 cross one another at 0.02 A and are 180 degrees out of phase with one another). Thus, the sum of the current signals 202 and 204 is constant at 0.04 A, as shown by the waveform at reference numeral 206. However, as shown by the current signal at reference numeral 200, the differential current created by the signals 202 and 204 is sinusoidal. To produce the currents shown in FIG. 2, the current sources and the cascode transistors of each unit cell are always ON and operate in correct bias voltage conditions. However, because the class A operating mode always consumes energy, even when a zero current differential is desired, the class A operating mode has the attribute of high current consumption.

An illustration of the class B operating mode is shown in FIG. 3. In general, the class B operating mode is one in which during the production of a positive output current the switches controlling IOUTP+ are turned ON proportionally to input signal amplitude, while the switches controlling IOUT− are all turned OFF. Conversely, for the production of a negative current, the switches controlling IOUT+ are turned OFF, while the switches controlling IOUT− are turned ON proportionally to the input signal. As shown in FIG. 3, a differential output signal 200 is produced by a differential between only positive half-cycle currents IOUT+ 302 and IOUT− 304. As described above, when the current IOUT+ is positive, the current IOUT− is 0; conversely, where the current IOUT− is positive, the current IOUT+ is 0. Thus, in the class B mode of operation, no switches are turned ON during the production of a zero differential output current. Accordingly, the current that is drawn from the current supply is proportional to the amplitude of the input signal, as shown at reference numeral 306. In the class B operating mode, the DAC has the lowest operating power for a given input signal.

While class B mode is efficient, in class B mode, when the current sources and cascodes are turned OFF completely and then turned ON, the transient glitches couple to sensitive bias nodes in the unit cells. As these bias nodes are usually driven by analog circuits having finite output impedance and parasitic or intentional capacitors, the disturbance in the bias voltages are carried forward to clock periods other than the one in which the glitches occurred. This leads to severe distortion in the output of the line driver/DAC.

BRIEF DESCRIPTION OF THE DRAWINGS

Figure 1:
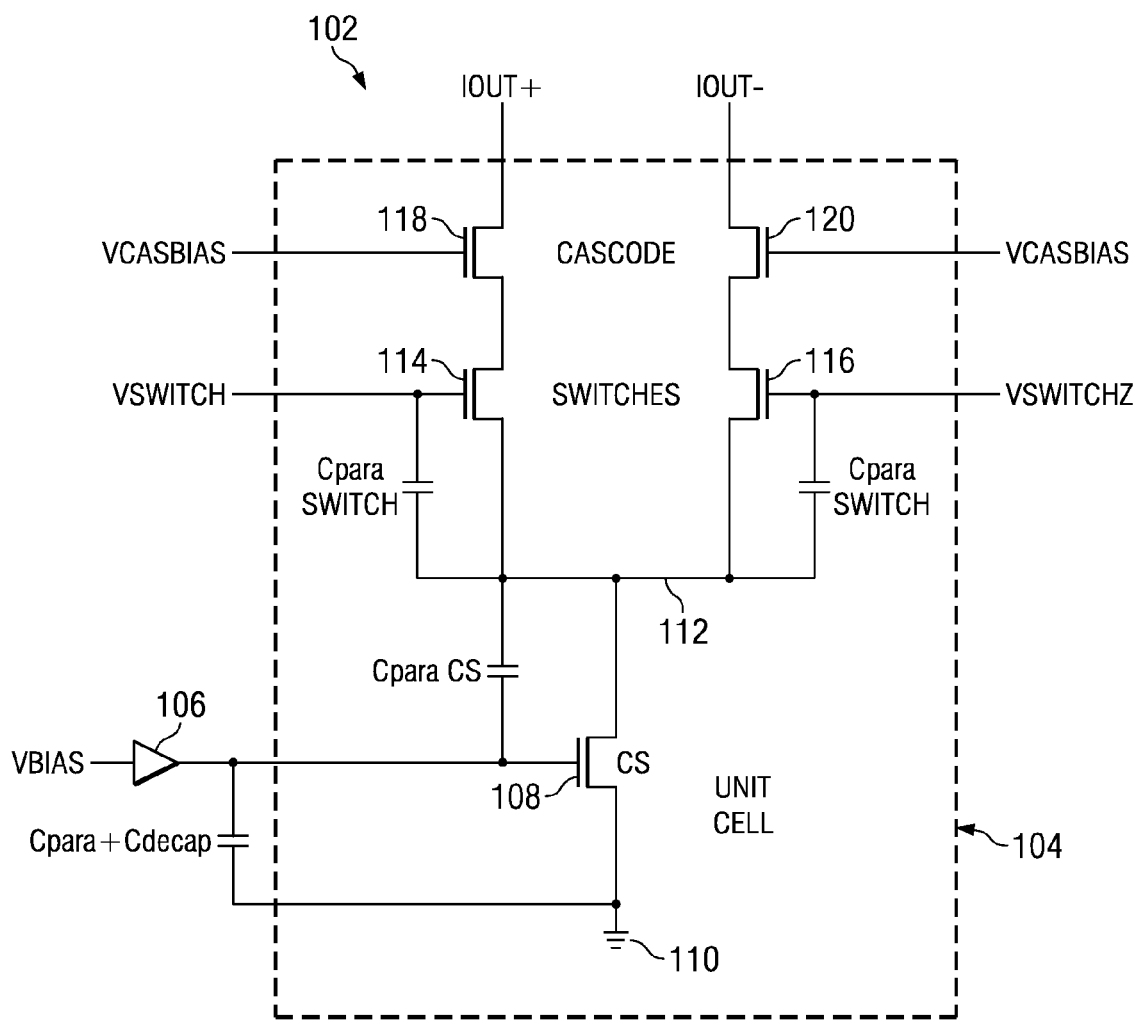

Having thus described the invention in general terms, reference will now be made to the accompanying drawings, which are not necessarily drawn to scale, and wherein:

FIG. 1 is a diagram illustrative of an example unit cell.

Figure 2:
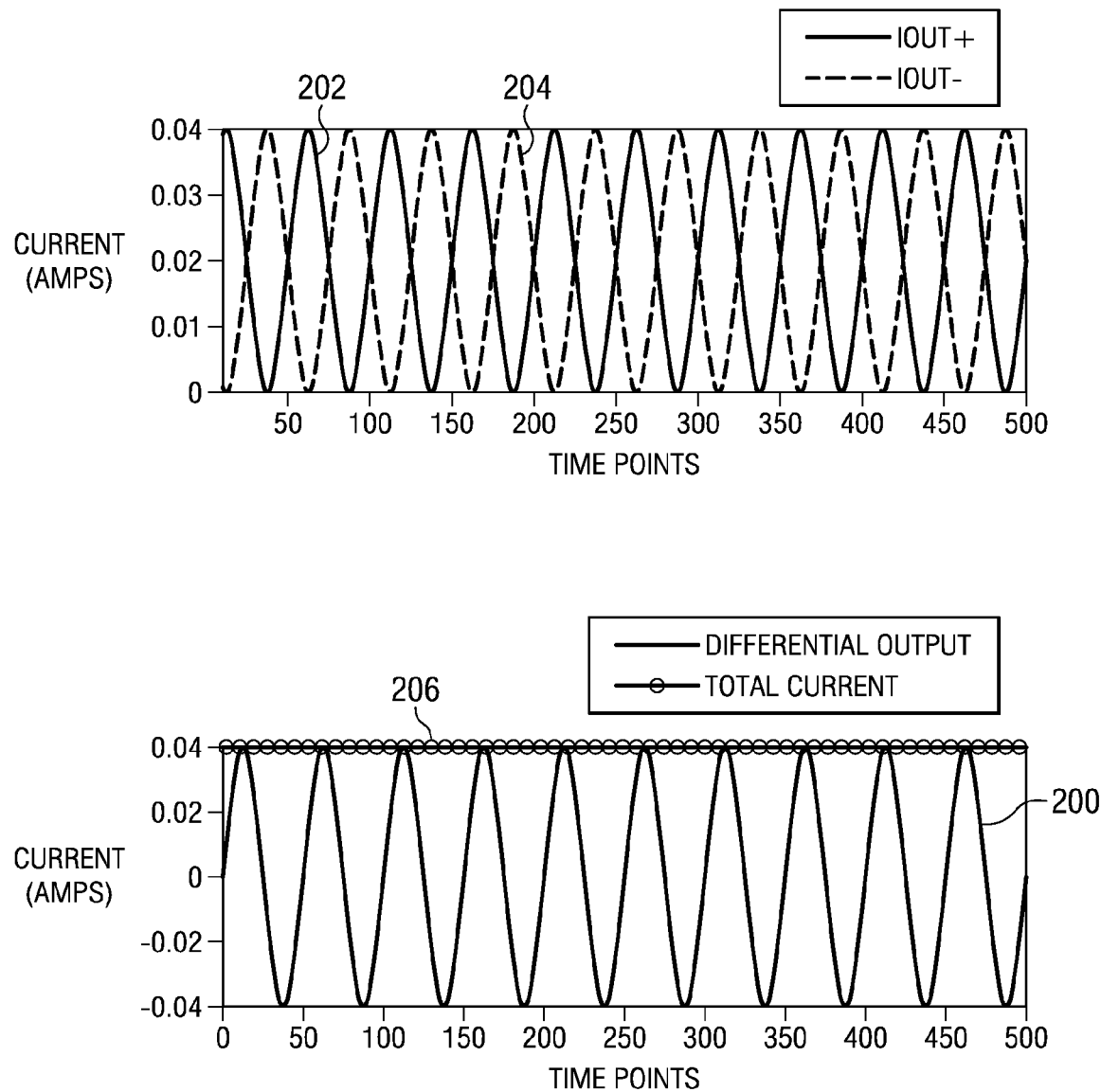

FIG. 2 is a graph showing Class A operation.

Figure 3:
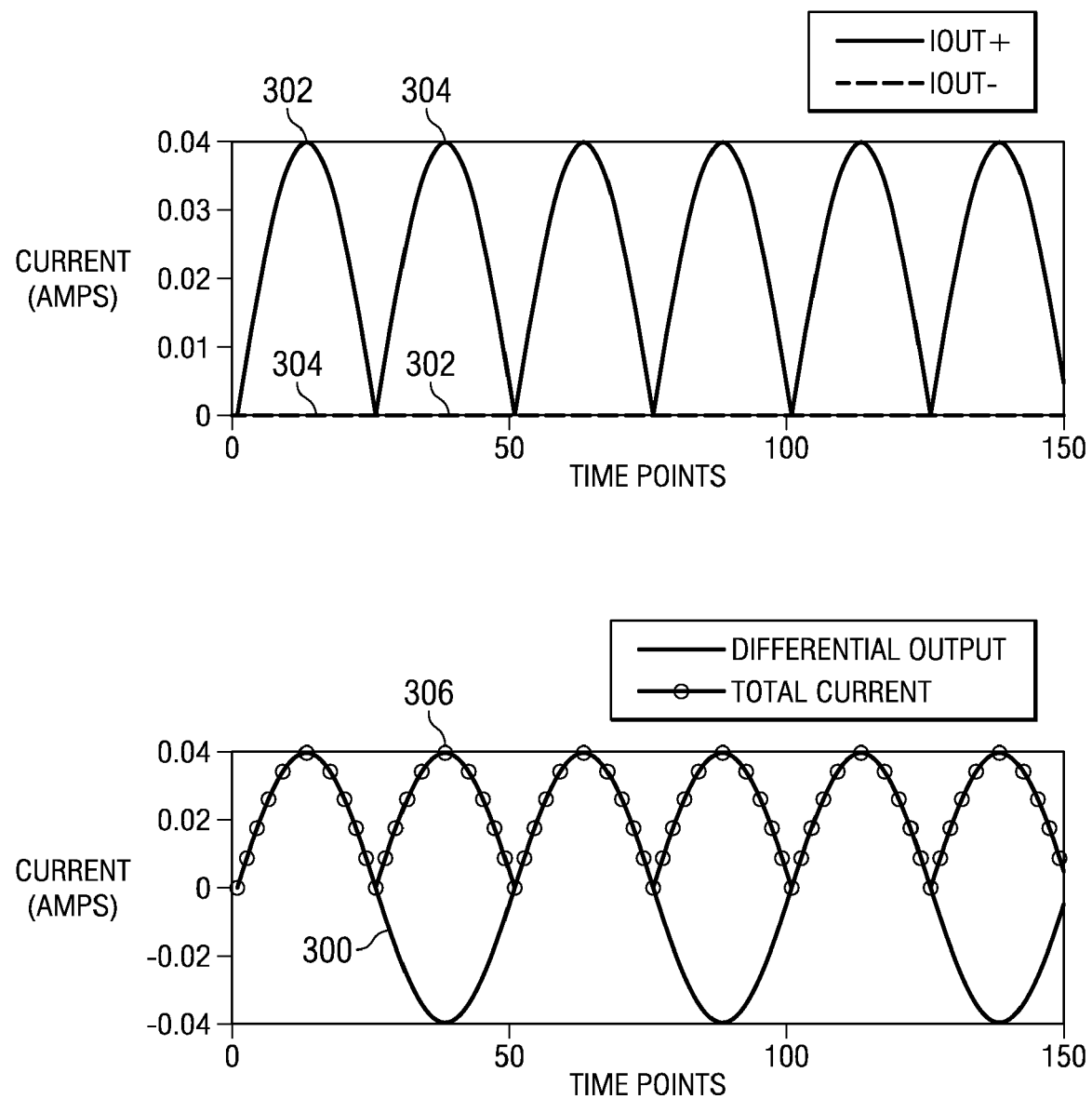

FIG. 3 is a graph showing Class B operation.

Figure 4:
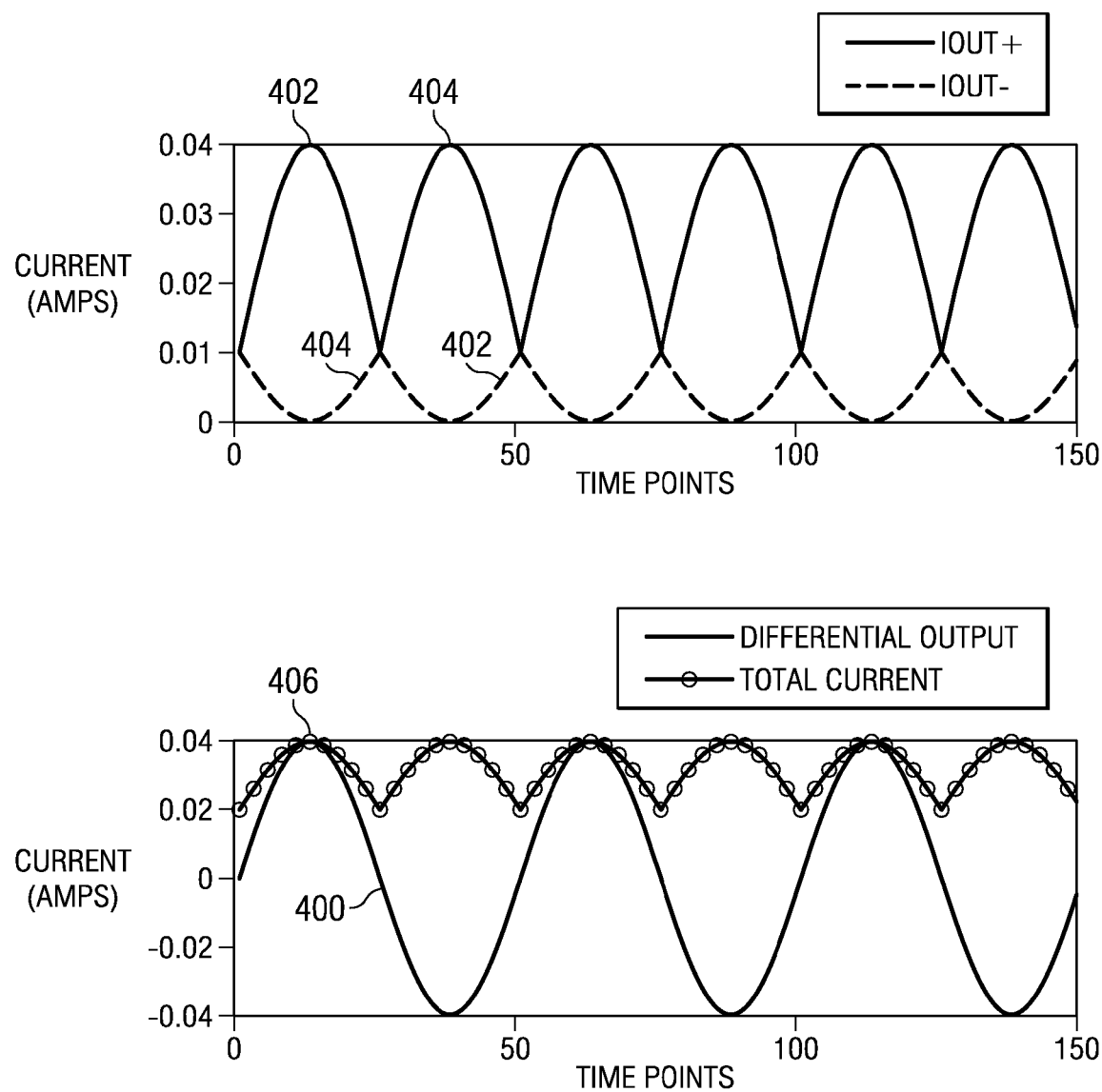

FIG. 4 is a diagram illustrative of Class AB Operation (AB Factor=0.5).

Figure 5:
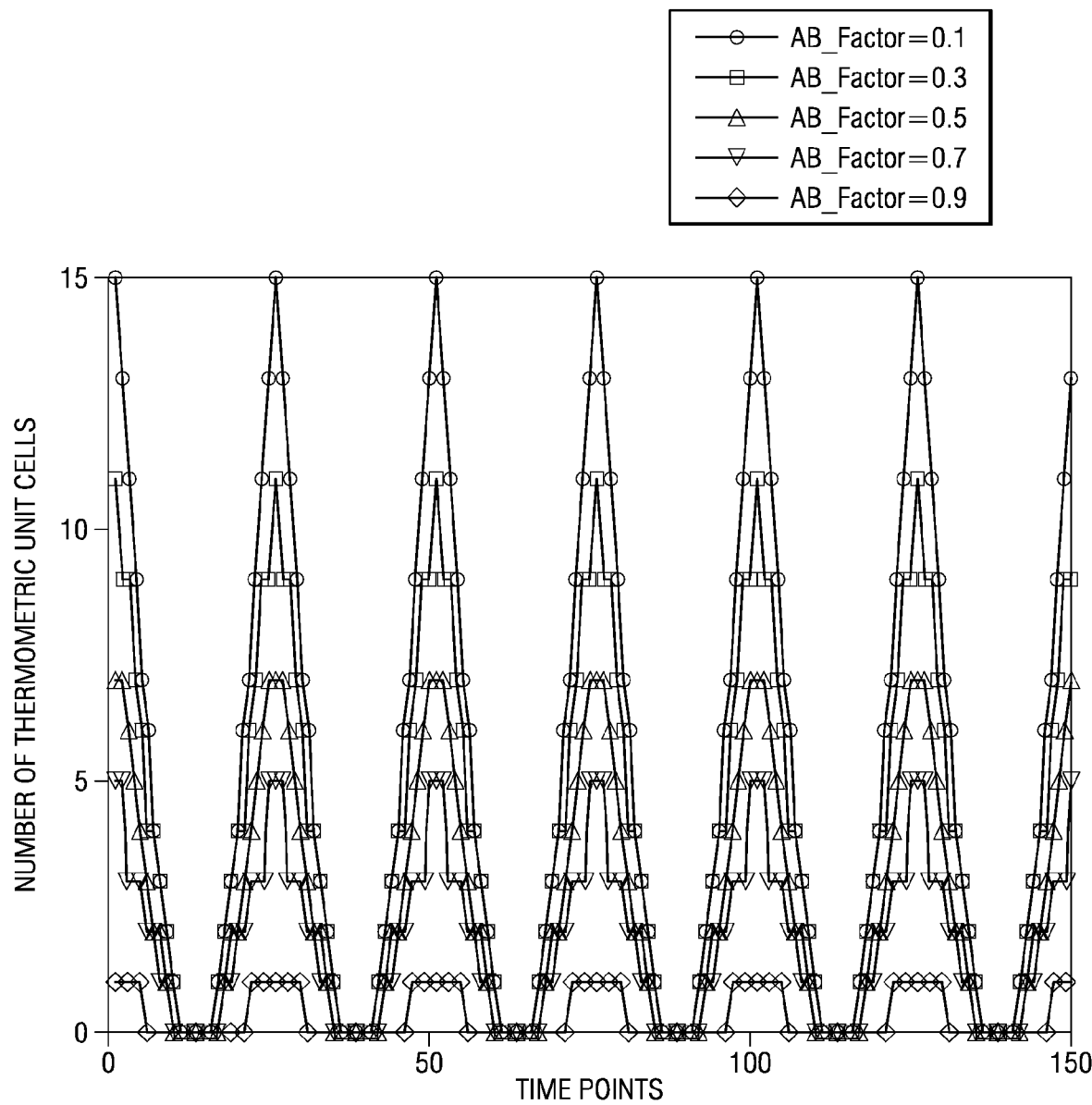

FIG. 5 is a graph showing AB_Factor vs. No. of Units cells in Class B mode in a 8 bit DAC.

Figure 6:
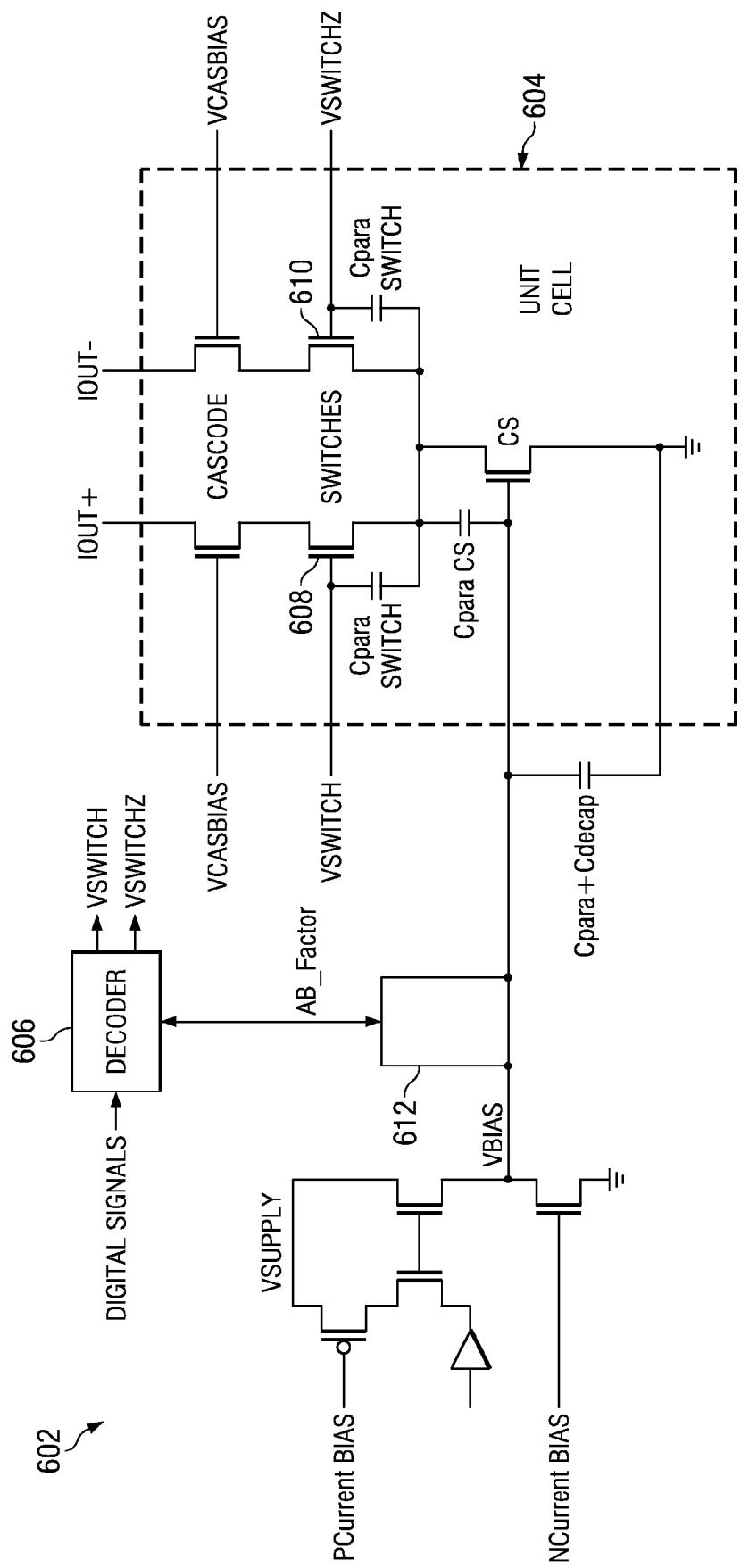

FIG. 6 is a diagram illustrating an example low impedance bias scheme with charge injection cancellation.

Figure 7:
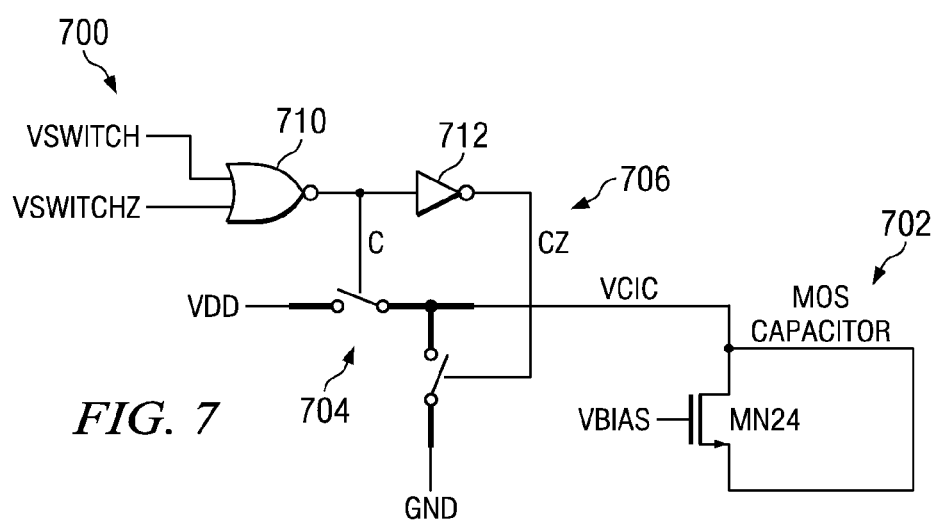

FIG. 7 is a diagram illustrative of a charge injection cancellation scheme, which is repeated for every unit cell in the LD/DAC.

DETAILED DESCRIPTION

As noted above, each of class A and class B modes of unit cell operation has operational issues. A method is described hereinafter to operate a DAC in varying proportions of class A and class B modes simultaneously (i.e., class AB), thereby offering different linearity/power tradeoffs. As further described below, the operation of the class AB system enables the numbers of DAC unit cells that operate in class A and class B modes to be adjusted.

Examples illustrating aspects of the invention are described more fully hereinafter with reference to the accompanying drawings. However, it should be noted that such examples should not be construed as limiting and, in fact, aspects of the invention may be implemented in various different forms. Rather, the examples herein are provided so that this description will be thorough and complete so that one having ordinary skill in the art will be able to make and use the various examples described herein without undue experimentation.

As described above in conjunction with FIG. 1, in class A mode, for a sine wave input, the IOUT+ and IOUT− output currents 102, 104 intersect exactly at $Ip_{EAK}/2$. As additionally described above in conjunction with FIG. 2, in class B mode, for a sine wave input, the IOUT+ and IOUT− output currents 202, 204 intersect at 0. As described below, in class AB mode, the IOUT+ and IOUT− output currents intersect point at a location between 0 and $Ip_{EAK}/2$, by selectively choosing the number of unit cells that operate in class A and class B modes. For example, if this intersection point is placed at IpEAK/4, then 50% of the DAC unit cells operate in Class B mode while the balance operated in class A mode.

As shown in FIG. 4, to produce a differential current signal 400, the signal IOUT+ 402 ranges between 0.01 A and 0.04 A during positive half cycles of the differential signal 404, and between 0.01 A and 0 A during the negative half cycles of the differential signal 404. Conversely, the signal IOUT− 406 ranges between 0.01 A and 0.04 A during negative half cycles of the differential signal 404, and between 0.01 A and 0 A during the positive half cycles of the differential signal 404. The resulting total current provided by the supply varies as shown at reference numeral 406. Operating in this manner ensures that the number of current sources in which both IOUT+ and IOUT− switches are turned OFF simultaneously can be reduced by about half. This, in turn, proportionally reduces the amount of transient glitches and corresponding non-linearity associated with class B mode switching. However, as shown at the signal 406, the power consumption is proportionately increased over that of pure class B operation.

The ratio the current intersection point in AB mode to $Ip_{EAK}/2$, is defined as the AB_Factor. Thus, an AB_Factor of 1 is class A mode operation as shown in FIG. 1. Conversely, an AB_Factor of 0 is pure class B mode operation. As the AB_Factor increases from 0 (i.e., from pure class B mode operation toward pure class A mode of operation), the no. of DAC or line driver (LD) unit cells operating in class B mode progressively decreases. For example, considering an 8 bit LD/DAC used in gigabit Ethernet system, having 4 thermometric weighted bits and 4 binary weighted bits, for a sine wave input, as the AB_Factor increases from 0.1 to 0.9, the number of unit cells operating in Class B mode progressively decreases as shown in FIG. 5.

This class AB implementation of placing an intersection point for IOUT+ and IOUT− between 0 and $Ip_{EAK}/2$ is achieved by controlling the drive signals coupled to the switches of the unit cells. In other words, the class AB implementation may be carried out in a purely digital fashion in hardware, software, firmware, or any suitable combination of the same. For that matter, any form of logic, such as decoders used to drive the DAC cell switches, may be used to implement the class AB solution described herein. Due to the fact that the class AB solution is digital, the intersection point between the IOUT+ and the IOUT− signals (i.e., the AB_Factor) may be programmable using three or four digital control bits. Advantageously, the class AB solution, which may be implemented in DAC decoders, does not require any additional analog or digital hardware to convert a conventional DAC to a DAC capable of operating in class AB mode. As opposed to using analog methods to reduce the glitches associated with class B mode of operation, the class AB solution reduces overall non-linearity by limiting the number of current sources in the DAC that operate in class B mode, based on the programmable AB_Factor that may be set using digital bits.

The foregoing describes a class AB system and solution in which some DAC unit cells operate in class A mode and some DAC unit cells operate in class B mode. Due to the fact that some of the unit cells still operate in class B mode, there may still be glitches that are generated as a result of the class B operating DAC unit cells. The glitches from such unit cells may be coupled to sensitive bias nodes within one or more DAC unit cells. To address the glitches resulting from the class B mode of operation, as well as other operational deficiencies, several approaches may be taken, either separately or in combination.

A solution to reduce the impact of glitches includes drastically reducing the output impedance of the bias node so that the bias node can quickly recover after a glitch from a class B operating cell is passed thereto. In one approach, this may be accomplished through the use of a source follower based bias generator.

Another solution to address glitches due to the class B operating mode unit cells is to include charge injection cancellation capacitors on the bias nodes. Such capacitors function to decouple or bypass to ground the glitches imparted on the bias node. The number of charge injection capacitors that are present in the circuit at a given time may be changed or switched out based on the number of class B operating unit cells. For example, a low AB_Factor requires means that a significant percentage of the unit cells are operating in class B mode, which means that the number glitches or the magnitude of a glitch may be significant. To address the increased glitching created by the unit cells operating in class B mode, a significant number of charge injection cancellation capacitors may be coupled to the bias node. Conversely, when the AB_Factor is closer to 1, fewer DAC unit cells are operating in class B mode. Accordingly, fewer numbers of charge injection cancellation capacitors are required, thus some charge injection cancellation capacitors may be switched out of the circuit and, thereby, disconnected from the bias node.

In some instances, bias generators suffer from a direct current (DC) error that is caused predominantly by process variations. To address this DC error, a tuning circuit may be used to fine-tune the bias voltage to the proper level.

FIG. 6 shows an example implementation of a circuit 600 including a bias portion 602 and a unit cell 604. Although only a single unit cell 604 is shown in FIG. 6, those having ordinary skill in the art will readily recognize that more unit cells are provided in DACs. Digital signals to be converted to analog signals are coupled to a decoder 606 that drives the switches 608, 610 of the unit cell 604. To reduce the output impedance of the bias portion 602, a source follower configuration is used to implement the bias portion. Furthermore, to reduce the affect of glitches on the bias signal, a charge injection cancellation unit 612 is provided, further detail of one example of which is provided in conjunction with FIG. 7.

As described above, a DAC may operate in a class AB mode of operation in which some of the unit cells (e.g., the unit cell 604) operate in the class A mode and some of the unit cells operate in the class B mode. The logic to facilitate this operation, which consists of timing signals provided to the switches of unit cells (e.g., the switches 608, 610 of the unit cell 604), lies in the decoder 606 that programmed to operate the unit cells in class A mode or class B mode in response to the AB_Factor that is provided to the decoder 606.

In some examples, the AB_Factor is also provided to the charge injection cancellation unit 612 so that the charge injection cancellation unit 612 can adjust the capacitance applied to the bias node. The lower the AB_Factor, the more capacitance is used to protect the bias node. Alternatively, a different technique may be used to switch the capacitance of the charge injection cancellation unit 612.

One example implementation of a charge injection cancellation unit is shown in FIG. 7 at reference numeral 700. The example charge injection cancellation unit 700 includes a capacitor 702, such as a MOS capacitor that may be implemented using a drain to source connected transistor, the gate of which is connected to the bias node (VBIAS). A switch 704 selectively couples the capacitor 702 between a supply voltage (VDD) and a ground voltage (gnd), to change the capacitance of the capacitor 702 as experiences at the bias node.

The switch 704 is controlled by logic 706. In the example logic 706 of FIG. 7, includes a NOR gate 710, the inputs to which are coupled the signals provided to the unit cell switches (e.g., the switches 608, 610). As will be readily appreciated by those having ordinary skill in the art, when both the inputs to the NOR gate 710 are logical zero, the output of the NOR gate 710 is a logical one, but is a logical zero otherwise. The signal output from the NOR gate 710 controls the switch 704 to selectively couple the capacitor 702 to the positive supply. In particular, the NOR gate 710 output is only a logical one when both positive and negative current switches are off (e.g., during a class B operating mode).

The output from the NOR gate 710 is also coupled to an inverter 712, the output of which controls the switch 704 to selectively couple the capacitor 702 to ground. Because the signal controlling the selective coupling of the capacitor 702 to ground and positive supply are separated by the inverter 712, the capacitor 702 is not simultaneously coupled to the positive supply and ground.

Of course, other modifications may be made to the charge injection cancellation unit 700 of FIG. 7. Additionally, such a unit may be implemented in every unit cell in a DAC so that the bias line may be protected during class B operation.

Many modifications and other embodiments of the invention will come to mind to one skilled in the art to which this invention pertains having the benefit of the teachings presented in the foregoing descriptions, and the associated drawings. Therefore, it is to be understood that the invention is not to be limited to the specific embodiments disclosed. Although specific terms are employed herein, they are used in a generic and descriptive sense only and not for purposes of limitation. Method to trade linearity for power in current steering Digital to Analog converter based line drivers using variable class mode operation.

What is claimed is:

1. A digital-to-analog converter (DAC) comprising:
    a source follower voltage supply providing a bias voltage on a bias node;
    a first unit cell including:
        a first current source coupled to the bias node;
        first and second switches coupled to the first current source; and
        first and second cascode transistors respectively coupled to the first and second switches and respectively providing a first positive output and a first negative output;
    a second unit cell including:
        a second current source coupled to the bias node;
        third and fourth switches coupled to the second current source; and
        third and fourth cascode transistors respectively coupled to the third and fourth switches and respectively providing a second positive output and a second negative output;
    a decoder coupled to the first, second, third, and fourth switches, wherein the decoder controls the first and second switches such that the first positive output and the first negative output comprise substantially equal magnitudes and wherein the first positive output and the first negative output are substantially one hundred eighty degrees out of phase, and wherein the decoder controls the third and fourth switches such that the second positive output is substantially zero when the second negative output non-zero; and
    a charge injection cancellation unit that is coupled to the bias node, wherein the charge injection cancellation unit includes:
        a logic gate that is coupled to the decoder;
        an inverter that is coupled to the logic gate;
        a capacitor that is coupled to the bias node;
        a fifth switch that is coupled to the capacitor and that receives the supply voltage, wherein the fifth switch is controlled by the logic gate; and
        a sixth switch that is coupled between the capacitor and ground, wherein the sixth switch is controlled by the inverter.

2. The DAC as defined by claim 1, wherein the DAC further comprises a first group of unit cells that operate in class A mode while a second group of unit cells operates in class B mode.

3. The DAC as defined by claim 1, wherein the logic gate further comprises a NOR gate.

4. The DAC as defined by claim 1, wherein the capacitor further comprises a MOS capacitor.

* * * * *